(12) United States Patent
Shimada et al.

(10) Patent No.: US 10,877,376 B2
(45) Date of Patent: Dec. 29, 2020

(54) LIGHT IRRADIATING DEVICE

(71) Applicant: Tokyo Electron Limited, Tokyo (JP)

(72) Inventors: Ryo Shimada, Koshi (JP); Kazuhiro Takeshita, Koshi (JP); Teruhiko Moriya, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/680,650

(22) Filed: Nov. 12, 2019

(65) Prior Publication Data

US 2020/0150537 A1 May 14, 2020

(30) Foreign Application Priority Data

Nov. 14, 2018 (JP) ................... 2018-213809

(51) Int. Cl.
*G03F 7/20* (2006.01)
*H01L 35/28* (2006.01)

(52) U.S. Cl.
CPC ........ *G03F 7/2008* (2013.01); *G03F 7/70891* (2013.01); *H01L 35/28* (2013.01); *G03F 7/70341* (2013.01)

(58) Field of Classification Search
CPC . H01R 13/53; G03F 7/70708; G03F 7/70891; H01L 35/28

USPC .......................................................... 355/133
See application file for complete search history.

(56) References Cited

U.S. PATENT DOCUMENTS 9,112,300 B2 * 8/2015 Damen .................. H01R 13/53
2010/0118287 A1 * 5/2010 Kikuchi .................... H01J 5/54
355/69

FOREIGN PATENT DOCUMENTS

JP 2018-084804 A 5/2018

* cited by examiner

*Primary Examiner* — Hung Nguyen
(74) *Attorney, Agent, or Firm* — Pearne & Gordon LLP

(57) ABSTRACT

A light irradiating device includes a substrate holder configured to hold a substrate; a light irradiating unit; and a power feed unit. The light irradiating unit comprises a light source configured to irradiate light to a surface of the substrate; and a first connector electrically connected with the light source. The power feed unit comprises a power supply module configured to supply a power to the light source; and a second connector electrically connected with the power supply module and configured to be connected to or disconnected from the first connector. The light irradiating unit and the power feed unit are coupled as one body as the first connector and the second connector are connected, and are separated from each other as the first connector and the second connector are disconnected from each other.

10 Claims, 6 Drawing Sheets

LIGHT IRRADIATING DEVICE

CROSS-REFERENCE TO RELATED APPLICATION

This application claims the benefit of Japanese Patent Application No. 2018-213809 filed on Nov. 14, 2018, the entire disclosures of which are incorporated herein by reference.

TECHNICAL FIELD

The various aspects and embodiments described herein pertain generally to a light irradiating device.

BACKGROUND

Patent Document 1 describes an exposure apparatus configured to irradiate light (LED light) to a surface of a substrate to expose a resist film provided on the surface of the substrate to the light. The exposure apparatus includes a light source unit which is located above a transfer path for the substrate.

Patent Document: Japanese Patent Laid-open Publication No. 2018-084804

SUMMARY

In one exemplary embodiment, a light irradiating device includes a substrate holder configured to hold a substrate; a light irradiating unit; and a power feed unit. The light irradiating unit comprises a light source configured to irradiate light to a surface of the substrate; and a first connector electrically connected with the light source. The power feed unit comprises a power supply module configured to supply a power to the light source; and a second connector electrically connected with the power supply module and configured to be connected to or disconnected from the first connector. The light irradiating unit and the power feed unit are coupled as one body as the first connector and the second connector are connected, and are separated from each other as the first connector and the second connector are disconnected from each other.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
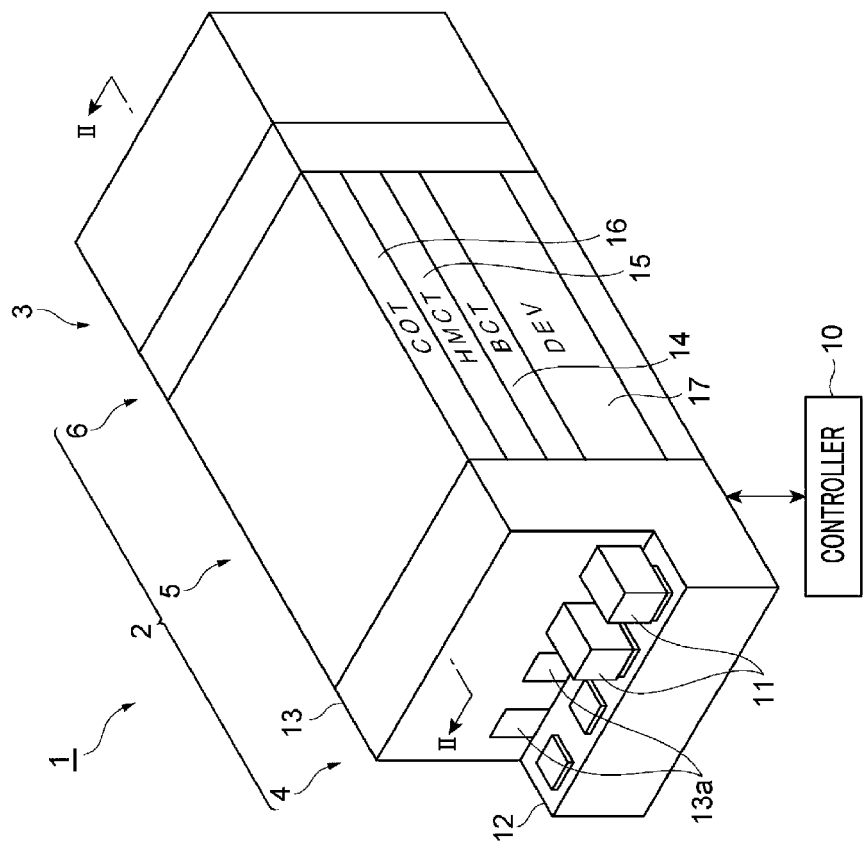
FIG. 1 is a perspective view illustrating an example of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings. In the following description, same parts or parts having same functions will be assigned same reference numerals, and redundant description will be omitted.

[Substrate Processing System]

Figure 2:
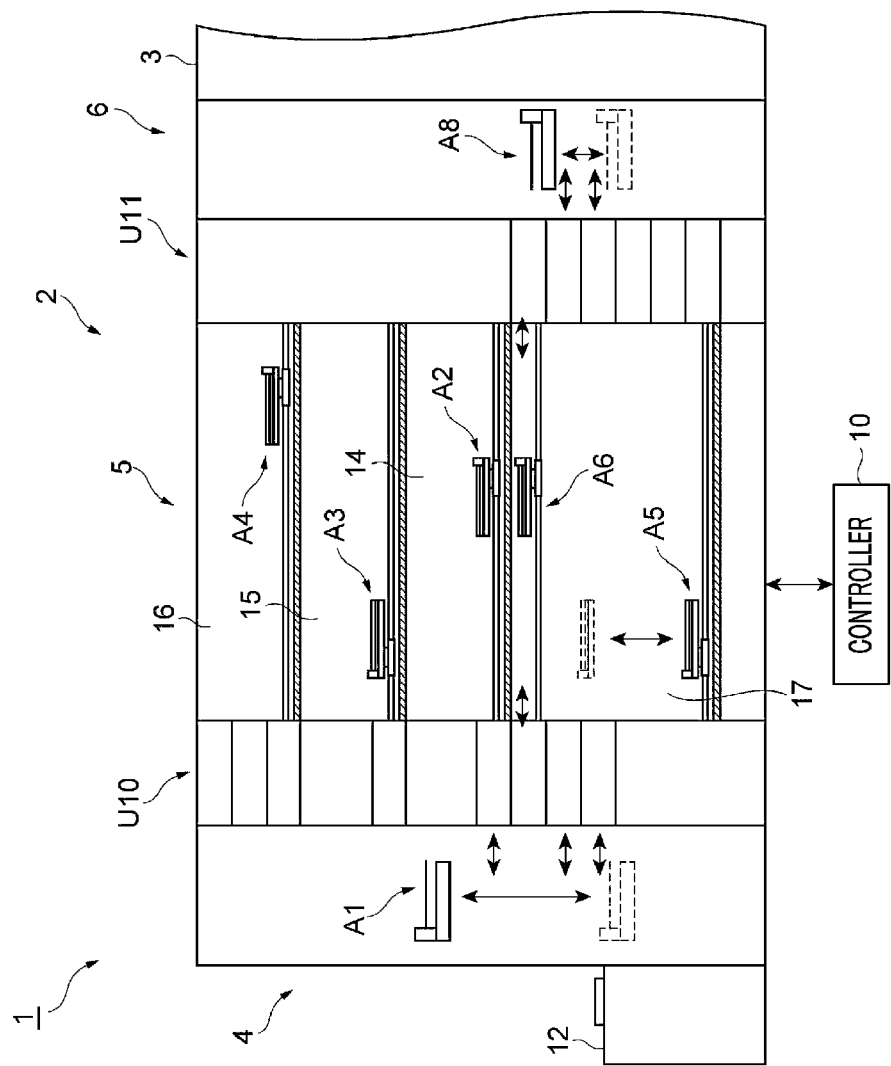
FIG. 2 is a cross sectional view taken along a line II-II of FIG. 1.

As depicted in FIG. 1 and FIG. 2, a substrate processing system 1 is equipped with a coating and developing apparatus 2, an exposure apparatus 3 and a controller 10 (control unit).

The exposure apparatus 3 is configured to perform an exposure processing (pattern exposure) of a resist film formed on a surface of a wafer W (substrate). To elaborate, the exposure apparatus 3 irradiates a radioactive ray 1 selectively to an exposure target portion of the resist film (photosensitive film) by an immersion exposure method or the like.

The radioactive ray 1 irradiated from the exposure apparatus 3 may be, by way of non-limiting example, an ionizing radiation or a non-ionizing radiation. The ionizing radiation is a radioactive ray having enough energy to ionize an atom or a molecule. The ionizing radiation may be, by way of non-limiting example, an EUV (wavelength: 13.5 nm), an electronic beam, an ion beam, a X-ray, an α-ray, a β-ray, a γ-ray, a baryon beam, a proton beam, or the like. The non-ionizing radiation is a radioactive ray which does not have enough energy to ionize an atom or a molecule. The non-ionizing radiation may be, by way of non-limiting example, a KrF excimer laser beam (wavelength: 248 nm), an ArF excimer laser beam (wavelength: 193 nm), a $F_2$ excimer laser beam (wavelength: 157 nm), a far ultraviolet ray (wavelength: 190 nm to 300 nm), or the like.

The coating and developing apparatus 2 is configured to perform a processing of forming the resist film on the surface of the wafer W prior to the exposure processing by the exposure apparatus 3, and, then, configured to perform a developing processing on the resist film after the exposure processing. The wafer W may have a circular plate shape, and a part of the circular shape may be notched. Alternatively, the wafer W may have a shape other than the circular shape, such as a polygonal shape. The wafer W may be, by way of example, but not limitation, a semiconductor substrate, a glass substrate, a mask substrate, a FPD (Flat Panel Display) substrate, or any of various other types of substrates. The wafer W may have a diameter ranging from, e.g., about 200 mm to about 450 mm.

As depicted in FIG. 1 to FIG. 4, the coating and developing apparatus 2 is equipped with a carrier block 4, a processing block 5, and an interface block 6. The carrier block 4, the processing block 5 and the interface block 6 are arranged in the horizontal direction.

Figure 3:
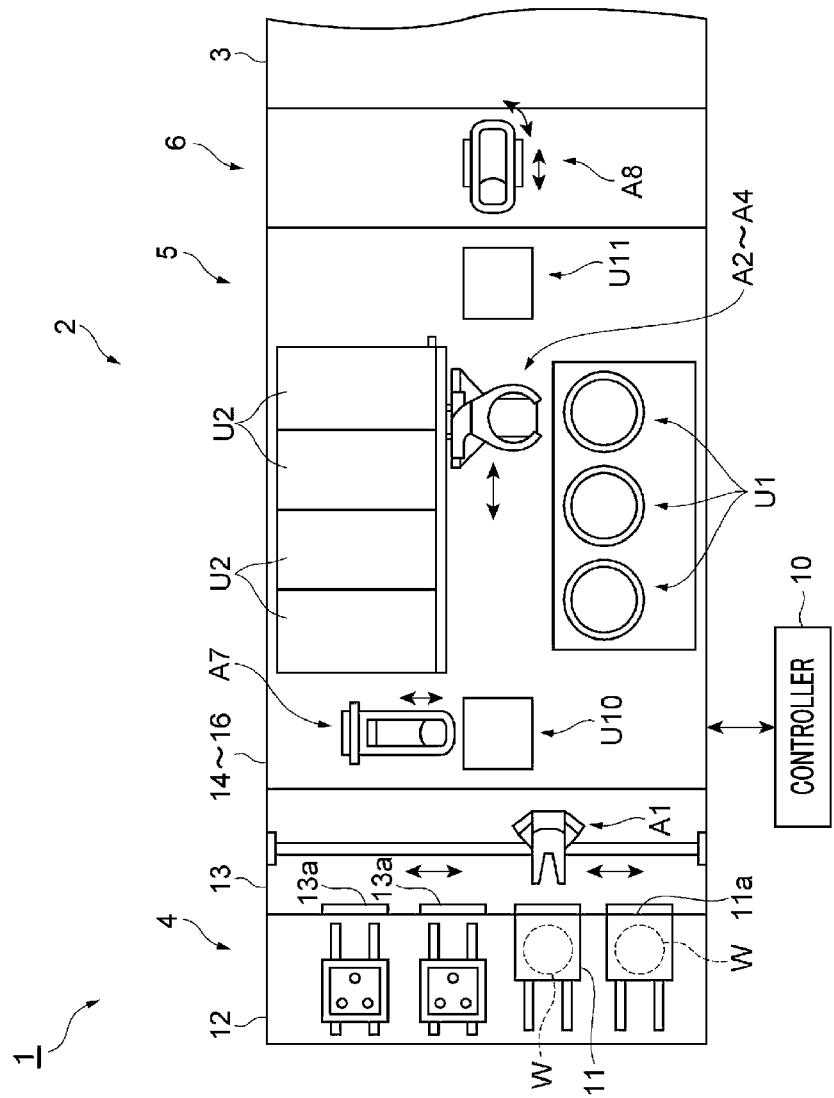
FIG. 3 is a top view illustrating processing modules (a BCT module, a HMCT module and a COT module)
Figure 4:
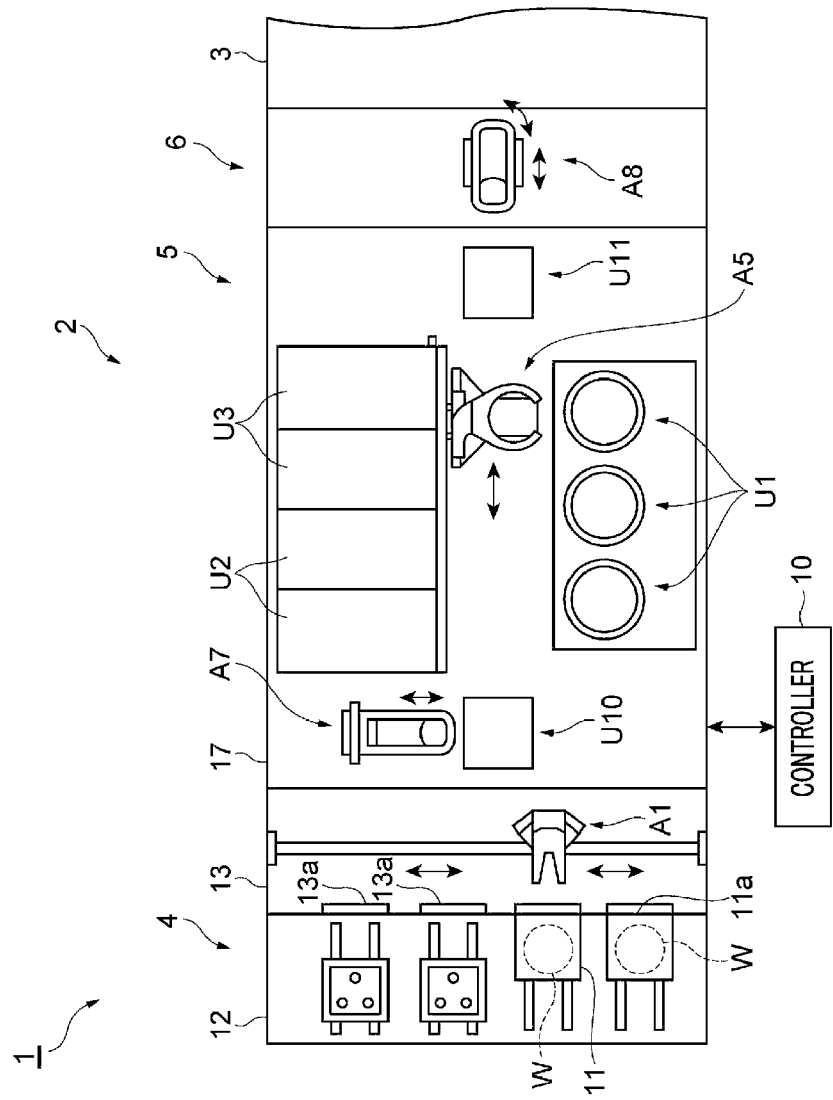
FIG. 4 is a top view illustrating a processing module (a DEV module)

As illustrated in FIG. 1, FIG. 3 and FIG. 4, the carrier block 4 is equipped with a carrier station 12 and a carry-in/out section 13. The carrier station 12 supports a plurality of carriers 11. Each of the carriers 11 accommodates at least one wafer W in a sealed state. An opening/closing door (not illustrated) through which the wafer W is carried in/out is provided on a side surface 11a of the carrier 11. The carrier 11 is detachably disposed on the carrier station 12 such that the side surface 11a faces the carry-in/out section 13.

The carry-in/out section 13 is located between the carrier station 12 and the processing block 5. The carry-in/out section 13 includes a plurality of opening/closing doors 13a. When the carrier 11 is placed on the carrier station 12, the opening/closing door of the carrier 11 directly faces the opening/closing door 13a. By opening the opening/closing door 13a and the opening/closing door on the side surface 11a at the same time, an inside of the carrier 11 communicates with an inside of the carry-in/out section 13. The carry-in/out section 13 incorporates a delivery arm A1. The delivery arm A1 is configured to take out the wafer W from the carrier 11 and deliver it to the processing block 5, and, also, is configured to receive the wafer W from the processing block 5 and return it into the carrier 11.

As illustrated in FIG. 1 to FIG. 4, the processing block 5 includes processing modules 14 to 17. The processing module 17, the processing module 14, the processing module 15 and the processing module 16 are stacked in this sequence from the bottom.

The processing module 14 is configured to form a bottom film on the surface of the wafer W, and is also called a BCT module. As illustrated in FIG. 2 and FIG. 3, the processing module 14 incorporates therein a plurality of units U1 and U2; and a transfer arm A2 configured to transfer the wafer W to these units U1 and U2. For example, each unit U1 is configured to coat the wafer W with a coating liquid for forming the bottom film, and each unit U2 is configured to perform a heating processing for hardening the coating film formed on the wafer W by the unit U1 to use this coating film as the bottom film. The bottom film may be, by way of example, an antireflection (SiARC) film.

The processing module 15 is configured to form an intermediate film (hard mask) on the bottom film, and is also called a HMCT module. As illustrated in FIG. 2 and FIG. 3, the processing module 15 incorporates therein a plurality of units U1 and U2; and a transfer arm A3 configured to transfer the wafer W to these units U1 and U2. Each unit U1 is configured to coat the wafer W with a coating liquid for forming the intermediate film. For example, each unit U2 is configured to perform a heating processing for hardening the coating film formed on the wafer W by the unit U1 to use this coating film as the intermediate film. The intermediate film may be, by way of example, but not limitation, a SOC (Spin On Carbon) film, an amorphous carbon film, or the like.

The processing module 16 is configured to form a thermosetting and photosensitive resist film on the intermediate film, and is also called a COT module. As depicted in FIG. 2 and FIG. 3, the processing module 16 incorporates therein a plurality of units U1 and U2; and a transfer arm A4 configured to transfer the wafer W to these units U1 and U2. Each unit U1 is configured to coat the wafer W with a coating liquid for forming a resist film. Each unit U2 is configured to perform a heating processing (PAB: Pre-Applied Bake) for hardening the coating film formed on the wafer W by the unit U1 to use this coating film as the resist film. The resist film may be a film made of, by way of example, a PSCAR (Photo Sensitized Chemically Amplified Resist).

The processing module 17 is configured to perform a developing processing on the exposed resist film, and is also called a DEV module. As shown in FIG. 2 and FIG. 4, the processing module 17 incorporates therein a plurality of units U1 to U3; a transfer arm A5 configured to transfer the wafer W to these units U1 to U3; and a transfer arm A6 configured to transfer the wafer W directly between shelf units U11 and U10 (to be described later) without passing through the units U1 to U3. Each unit U1 is configured to form a resist pattern by partially removing the resist film. Each unit U2 is configured to perform a heating processing after pattern exposure (PPEB: Post Pattern Exposure Bake), a heating processing after flood exposure (PFEB: Post Flood Exposure Bake), a heating processing after developing processing (PB: Post Bake), and so forth. The units U3 (light irradiating device) will be elaborate later.

As shown in FIG. 2 to FIG. 4, the processing block 5 includes the shelf unit U10 provided near the carrier block 4. The shelf unit U10 extends from a bottom surface of the processing block 5 to the processing module 16 and is partitioned into a plurality of cells arranged in the vertical direction. A transfer arm A7 is provided near the shelf unit U10. The transfer arm A7 is configured to move the wafer W up and down between the cells of the shelf unit U10.

The processing block 5 includes the shelf unit U11 disposed near the interface block 6. The shelf unit U11 extends from a bottom surface of the processing block 5 to an upper portion of the processing module 17 and is partitioned into a plurality of cells arranged in the vertical direction.

The interface block 6 incorporates a transfer arm A8, and is connected to the exposure apparatus 3. The transfer arm A8 is configured to take out the wafer W from the shelf unit U11 and deliver it to the exposure apparatus 3 and, also, to receive the wafer W from the exposure apparatus 3 and return it into the shelf unit U11.

The controller 10 is composed of one or more control computers and is configured to control the substrate processing system 1 partially or in overall.

[Configuration of Light Irradiating Device (Unit 3)]

Now, details of the unit U3 of the processing module 17, which serves as the light irradiating device, will be explained with reference to FIG. 5 and FIG. 6. The unit U3 is a device configured to further irradiate light to the resist film after being subjected to the pattern exposure by the exposure apparatus 3. By performing this two-stage exposure lithography process, a very fine resist pattern can be formed.

Figure 5:
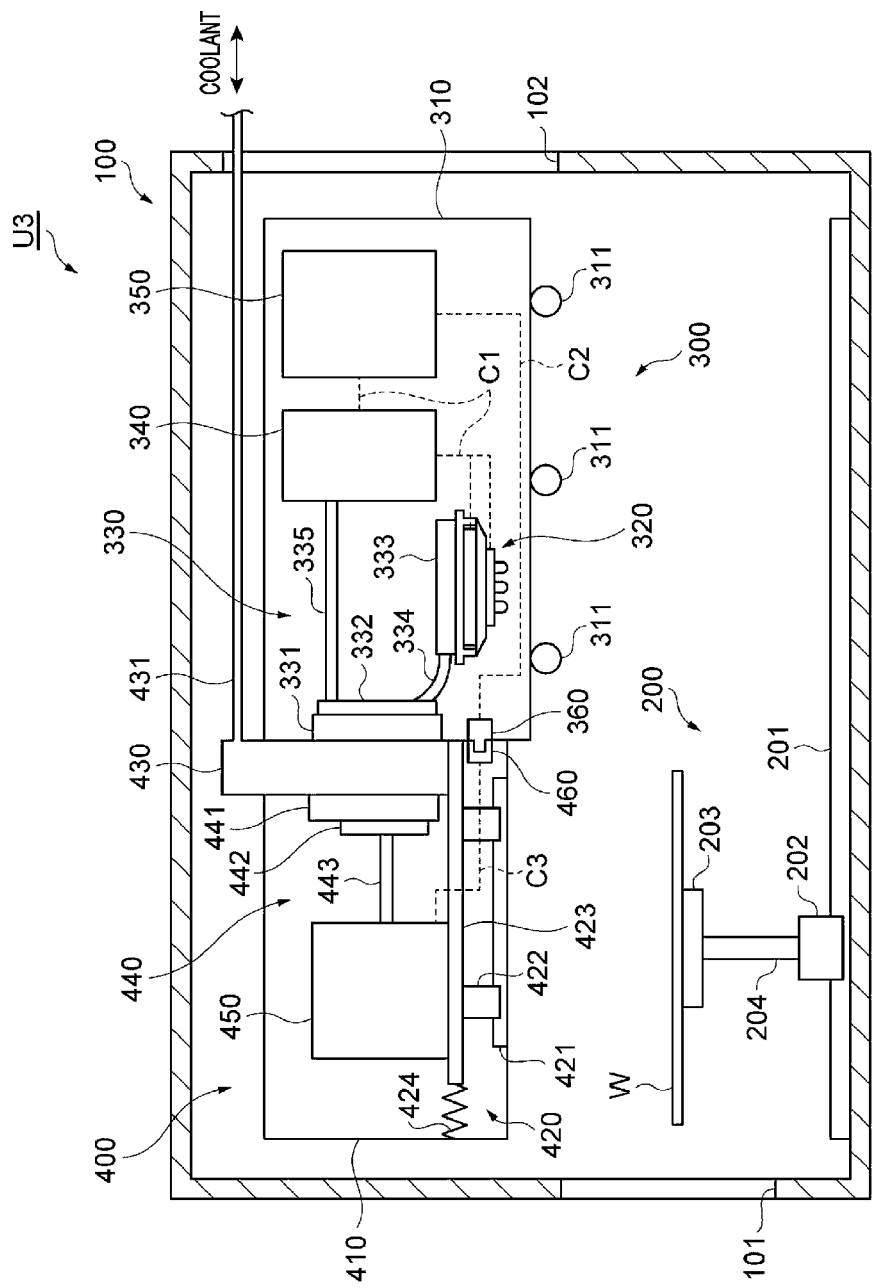
FIG. 5 is a cross sectional view illustrating an example of a light irradiating device.

As depicted in FIG. 5, the unit U3 includes a housing 100, a substrate holder 200, a light irradiating unit 300 and a power feed unit 400. An opening 101 is provided at one end of the housing 100. The wafer W is carried into or out of the housing 100 through the opening 101. An opening 102 is provided at the other end of the housing 100.

The substrate holder 200 includes a rail 201, a slider 202 and a holder 203. The rail 201 extends on a bottom surface of the housing 100 from one end to the other end of the housing 100. The slider 202 is configured to be movable along the rail 201 based on an operation signal from the controller 10. The holder 203 is fixed to the slider 202 via a shaft 204. The holder 203 is capable of holding the wafer W in a substantially horizontal posture. Accordingly, if the slider 202 is moved on the rail 201 while the wafer W is held on the holder 203, the wafer W is also moved horizontally along the rail 201.

The light irradiating unit 300 is disposed above the substrate holder 200. That is, the light irradiating unit 300 is disposed above a transfer path for the wafer W by the substrate holder 200. The light irradiating unit 300 includes a housing 310, a light source module 320, a heat transfer module 330, a driver module 340, a control module 350 and an electric connector 360 (first connector).

The housing 310 is located within the housing 100 to face the opening 102 of the housing 100. The housing 310 is disposed on a plurality of transfer rollers 311 and is movable on the transfer rollers 311 to approach and be distanced away from the power feed unit 400. With this configuration, when replacing the light irradiating unit 300, an operator can carry the light irradiating unit 300 into/from the housing 100 through the opening 102 by gripping the housing 310 and allowing the housing 310 to be moved on the transfer rollers 311.

Figure 6:
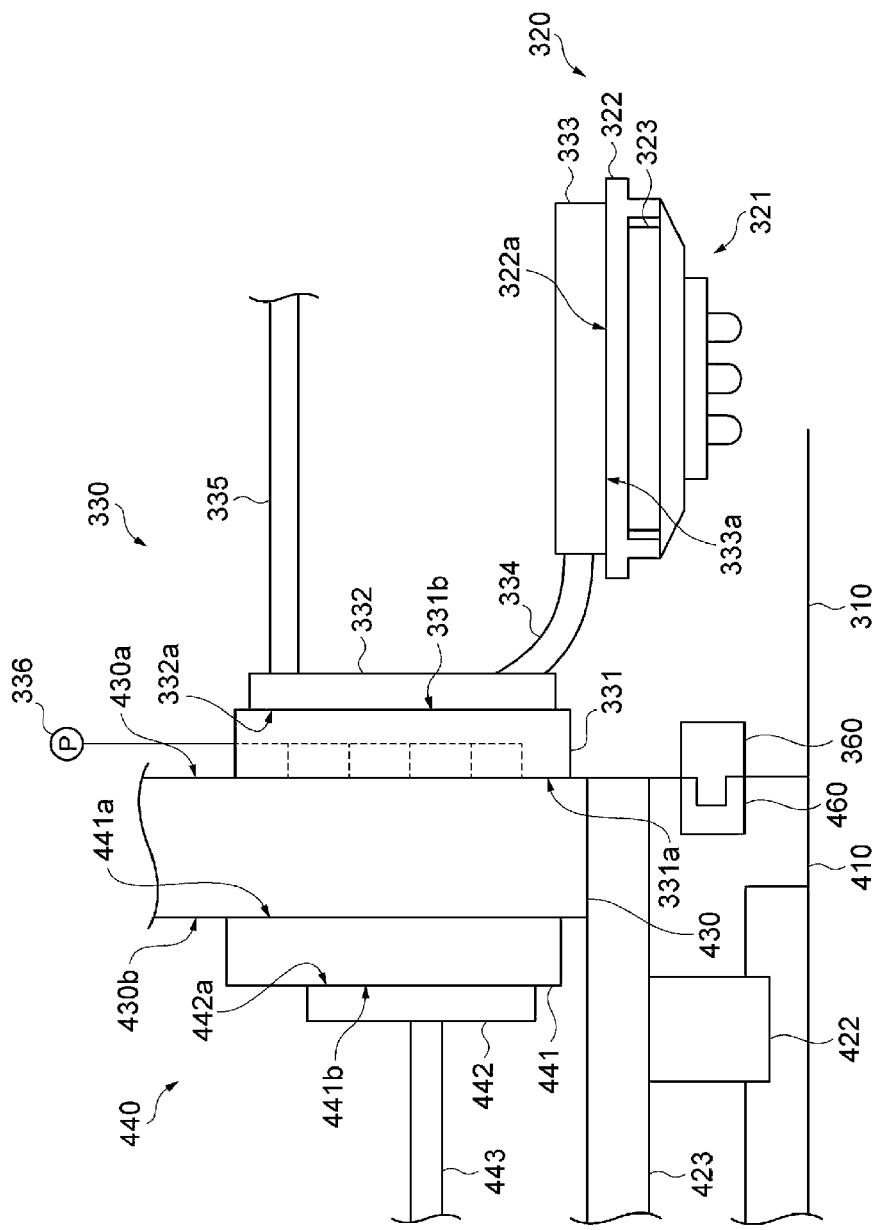
FIG. 6 is a cross sectional view illustrating a light source module and a vicinity thereof.

The light source module 320 includes, as illustrated in FIG. 6, a light source 321, a supporting body 322 and a thermoelectric device 323. The light source 321 is configured to irradiate preset light to the resist film after the PPEB. For example, the light source 321 may irradiate a radioactive ray having energy lower than a wavelength of the light irradiated from the exposure apparatus 3. This radioactive ray may be the non-ionizing radiation having a wavelength equal to or larger than, e.g., 360 nm. The non-ionizing radiation having the wavelength equal to or larger than 360 nm may be, by way of example, but not limitation, a near ultraviolet ray (UV-A), a g-ray, a i-ray, a h-ray, a visible light, an infrared ray, or the like. The light source 321 may expose the resist film to the light at a more uniform exposure amount on a region (for example, the entire surface of the resist film) larger than a region normally exposed in the pattern exposure. The light source 321 may be, by way of example, a LED light source.

The supporting body 322 is configured to support the light source 321 from above. The supporting body 322 may be made of a material having a relatively high thermal conductivity (for example, aluminum).

The thermoelectric device 323 is disposed between the light source 321 and the supporting body 322 to be held therebetween. The thermoelectric device 323 has a function of converting electrical energy to thermal energy based on an operation signal from the controller 10. The thermoelectric device 323 may be, by way of example, a Peltier element. A cooling part (lower portion of FIG. 6) of the thermoelectric device 323 faces the light source 321 and is thermally connected with the light source 321. A heating part (upper portion of FIG. 6) of the thermoelectric device 323 faces the supporting body 322 and is thermally connected with the supporting body 322. That is, heat generated by the light source 321 is cooled by the cooling part of the thermoelectric device 323, and heat generated by the heating part of the thermoelectric device 323 is transferred to the supporting body 322.

The heat transfer module 330 includes, as depicted in FIG. 5 and FIG. 6, an attraction member 331, heat transfer members 332 and 333, and heat pipes 334 and 335. The attraction member 331 may have, for example, a plate shape. The attraction member 331 may be made of a material having a relatively high thermal conductivity (for example, aluminum). The attraction member 331 has a main surface 331a (first contact surface) exposed to the outside of the housing 310 toward the power feed unit 400 and another main surface 331b at the opposite side from the main surface 331a. Each of the main surfaces 331a and 331b may be a flat surface.

The attraction member 331 is provided with a multiple number of fine holes (not shown) opened toward the main surface 331a. Base ends of the multiple number of fines holes are connected with a pump 336. If the pump 336 is operated based on an operation signal from the controller 10, the attraction member 331 is attracted to another member (a cooling module 430 to be described later) which is in contact with the main surface 331a. Meanwhile, if the pump 336 is stopped based on an operation signal from the controller 10, the attraction between the corresponding another member and the attraction member 331 is released.

Each of the heat transfer members 332 and 333 may have, for example, a plate shape. The heat transfer members 332 and 333 may be made of a material having a relatively high thermal conductivity (for example, aluminum). The heat transfer member 332 has a main surface 332a in contact with the main surface 331b of the attraction member 331, and is mounted to the attraction member 331. The main surface 332a may be a flat surface. In this case, since the main surfaces 331b and 332a may be easily in firm contact with each other, the heat transfer between the attraction member 331 and the heat transfer member 332 can be easily achieved.

The heat transfer member 333 has a main surface 333a in contact with a top surface 322a of the supporting body 322, and is mounted to the supporting body 322. The main surface 333a may be a flat surface. In this case, since the main surfaces 322a and 333a may be easily in firm contact with each other, the heat transfer between the supporting body 322 and the heat transfer member 333 can be easily achieved.

Each of the heat pipes 334 and 335 has a function of transferring heat from one end to the other end thereof by movement of a hydraulic fluid circulated therein. The heat pipe 334 connects the heat transfer member 332 and the heat transfer member 333. The heat pipe 334 is configured to transfer the heat from the heat transfer member 333 to the heat transfer member 332. The heat pipe 335 connects the heat transfer member 332 and the driver module 340, as shown in FIG. 5. The heat pipe 335 is configured to transfer the heat from the driver module 340 to the heat transfer member 332.

The driver module 340 serves as a device driver configured to drive the light source 321 and the thermoelectric device 323 individually in response to control signals from a control module 350. The driver module 340 is connected to the light source 321, the thermoelectric device 323 and the control module 350 by a signal line C1.

The control module 350 has a function of controlling operations of the light source 321 and the thermoelectric device 323 through the driver module 340. The control module 350 is electrically connected with a power supply module 450 (to be described later) of the power feed unit 400, and is operated by a power fed from the power supply module 450.

The electric connector 360 is connected (engaged) with an electric connector 460 (to be described later) of the power feed unit 400, and has a function of delivering a power or an electric signal therebetween. The electric connector 360 is exposed to the outside of the housing 310 toward the power feed unit 400. The electric connector 360 is electrically connected with the control module 350 via an electric wire C2 which extends within the housing 310.

Like the light irradiating unit 300, the power feed unit 400 is also disposed above the substrate holder 200. That is, the power feed unit 400 is disposed above the transfer path for the wafer W by the substrate holder 200. The power feed unit 400 includes a housing 410, a pressing module 420, a cooling module 430, a heat transfer module 440, a power supply module 450 and the electric connector 460 (second connector).

The housing 410 is located within the housing 100 to face the housing 310.

The pressing module 420 includes a rail 421, a slider 422, a table 423 and a pressing member 424. The rail 421 extends on a bottom surface of the housing 410 from one end to the other end of the housing 410. The slider 422 is configured to be movable along the rail 421. The table 423 is supported by the slider 422 and is configured to place thereon the cooling module 430, the heat transfer module 440 and the power supply module 450. With this configuration, if the table 423 is moved on the rail 421 via the slider 422, the cooling module 430, the heat transfer module 440 and the power supply module 450 are also moved horizontally on the rail 421.

The pressing member 424 is configured to press the table 423 toward the light irradiating unit 300. Thus, in case that the light irradiating unit 300 and the power feed unit 400 are separated, a main surface 430a (to be described later) of the cooling module 430 is slightly protruded outer than a sidewall of the housing 410. One end of the pressing member 424 may be connected to a sidewall of the housing 410, and the other end of the pressing member 424 may be connected to the table 423. The pressing member 424 may be, by way of example, a compression coil spring.

The cooling module 430 has a function of performing heat exchange with respect to the heats transferred through the heat transfer modules 330 and 440 to thereby cool the heat transfer modules 330 and 440. A path through which a coolant flows may be provided within the cooling module 430. The coolant may be, by way of example, water. Connected to the cooling module 430 is a pipeline 431 through which the coolant is introduced into the cooling module 430 and the coolant used for the heat exchange is drained from the cooling module 430. The pipeline 431 extends to the outside of the unit U3 through the opening 102 without passing through the light irradiating unit 300 (housing 310), and is connected to a liquid source outside of the unit U3.

The cooling module 430 may have, for example, a rectangular parallelepiped shape. The cooling module 430 has the main surface 430a (second contact surface) facing the heat transfer module 330 and a main surface 430b facing the heat transfer module 440. The main surfaces 430a and 430b may be flat surfaces. In this configuration, since the main surfaces 331a and 430a may be easily in firm contact with each other when the attraction member 331 is attracted to the cooling module 430, the heat transfer between the cooling module 430 and the attraction member 331 can be easily achieved.

The heat transfer module 440 includes, as depicted in FIG. 5 and FIG. 6, heat transfer members 441 and 442 and a heat pipe 443. The heat transfer member 441 may have, for example, a plate shape. The heat transfer member 441 may be made of a material having a relatively high thermal conductivity (for example, aluminum). The heat transfer member 441 has a main surface 441a facing the main surface 430b of the cooling module 430; and another main surface 441b at the opposite side from the main surface 441a. Each of the main surfaces 441a and 441b may be a flat surface.

The heat transfer member 442 may have, for example, a plate shape. The heat transfer member 442 may be made of a material having a relatively high thermal conductivity (for example, aluminum). The heat transfer member 442 has a main surface 442a in contact with the main surface 441b of the heat transfer member 441 and is mounted to the heat transfer member 441. The main surface 442a may be a flat surface. In this configuration, since the main surfaces 441b and 442a are easily in firm contact with each other, the heat transfer between the heat transfer member 441 and the heat transfer member 442 can be easily achieved.

The heat pipe 443 has a function of transferring heat from one end to the other end thereof by movement of a hydraulic fluid circulated therein. The heat pipe 443 connects the heat transfer member 442 and the power supply module 450, as shown in FIG. 5. The heat pipe 443 is configured to transfer the heat from the power supply module 450 to the heat transfer member 442.

The power supply module 450 has a function of supplying a power to the control module 350.

The electric connector 460 is connected (engaged) with the electric connector 360 of the light irradiating unit 300 and has a function of delivering a power or an electric signal therebetween. The electric connector 460 is exposed to the outside of the housing 410 toward the light irradiating unit 300. The electric connector 460 is electrically connected with the power supply module 450 via an electric wire C3 which extends within the housing 410.

[Sequence of Replacement]

Now, a sequence of replacing the light irradiating unit 300 will be explained. First, when separating the light irradiating unit 300 which is degraded, the pump 336 is stopped to release the attraction between the heat transfer module 330 and the cooling module 430. Then, the operator gets a hold of the housing 310 through the opening 102 and pulls the housing 310 toward the opening 102. At this time, the connection between the electric connectors 360 and 460 is released.

Meanwhile, when mounting a new light irradiating unit 300 to the power feed unit 400, the new light irradiating unit 300 is carried in through the opening 102 and pushed in until the light irradiating unit 300 comes into contact with the power feed unit 400. At this time, the electric connectors 360 and 460 are connected. Then, the pump 336 is operated to attract the heat transfer module 330 and the cooling module 430.

[Effects]

According to the above-described exemplary embodiment, the light source 321 is not accommodated in the one and same housing together with the other various kinds of devices nearby, but the light irradiating unit 300 including the light source 321 and the power feed unit 400 including the power supply module 450 are configured to be assembled or separated individually. Thus, to replace the light source 321, only the light irradiating unit 300 needs to be separated from the unit U3 (light irradiating device) without separating the power feed unit 400. Therefore, the replacement of the light source 321 can be carried out in the easy and simple way, so that the maintenance can be improved.

According to the above-described exemplary embodiment, in the state that the light irradiating unit 300 and the power feed unit 400 are connected as one body, the heat transfer module 330 and the cooling module 430 are thermally connected, and the light source 321 provided in the light irradiating unit 300 is cooled by the cooling module 430 provided in the power feed unit 400. Accordingly, when the light source 321 is operated, the heat generated from the light source 321 is cooled by the cooling module 430, so that a variation of a wavelength of the light caused by a temperature drift can be suppressed. Meanwhile, when replacing the light source 321, since the cooling module 430 is provided in the power feed unit 400 which is not a target of the replacement, it is unnecessary to disassemble and re-assemble the cooling module 430. Therefore, in the replacement of the light source 321, a series of operations including the recovery of the coolant, the disassembling and the re-assembling of the cooling module 430 and the charging of the coolant of the cooling module 430 is not necessary. Therefore, the maintenance can be further improved.

According to the above-described exemplary embodiment, in the state that the light irradiating unit 300 and the power feed unit 400 are coupled as one body, the main surface 331a of the heat transfer module 330 and the main surface 430a of the cooling module 430 are in contact with each other. Therefore, since an area where the heat exchange is performed is relatively large, the light source 321 can be effectively cooled.

According to the above-described exemplary embodiment, the heat transfer module 330 is configured to be attracted to the cooling module 430. Accordingly, the connection/separation of the heat transfer module 330 to/from the cooling module 430 can be carried out very easily. Furthermore, since the heat transfer module 330 can be easily brought into firm contact with the cooling module 430 through the attraction, the light source 321 can be more effectively cooled.

According to the above-described exemplary embodiment, the temperature of the light source 321 is controlled by the thermoelectric device 323 (Peltier element). Accordingly, the temperature of the light source 321 can be maintained at a target temperature with high accuracy.

According to the above-described exemplary embodiment, the cooling module 430 is pressed against the heat transfer module 330 via the pressing member 424. Accordingly, the cooling module 430 and the heat transfer module 330 are allowed to come into firm contact with each other more easily, and, thus, the light source 321 can be cooled more effectively.

MODIFICATION EXAMPLES

So far, the exemplary embodiment of the present disclosure has been described. However, it should be noted that various changes and modifications may be made without departing from the scope of the present disclosure.

(1) The heat transfer module 330 may be pressed against the cooling module 430 by a single pressing member, or the heat transfer module 330 and the cooling module 430 may be pressed against each other by a plurality of pressing members.

(2) The unit U3 may not be equipped with the pressing member 424.

(3) By pressing the heat transfer module 330 against the cooling module 430, not by the attraction, the heat transfer module 330 and the cooling module 430 can be brought into firm contact with each other.

OTHER EXAMPLES

Example 1

A light irradiating device includes a substrate holder configured to hold a substrate; a light irradiating unit; and a power feed unit. The light irradiating unit comprises a light source configured to irradiate light to a surface of the substrate; and a first connector electrically connected with the light source. The power feed unit comprises a power supply module configured to supply a power to the light source; and a second connector electrically connected with the power supply module and configured to be connected to or disconnected from the first connector. The light irradiating unit and the power feed unit are coupled as one body as the first connector and the second connector are connected, and are separated from each other as the first connector and the second connector are disconnected from each other. If an output of the light source is degraded as the light source is used for a long time, there may be an adverse influence upon the quality of the exposure. Thus, the light source needs to be replaced appropriately. According to the example 1, the light source is not accommodated in the one and same housing together with the other various kinds of devices nearby, but the light irradiating unit including the light source and the power feed unit including the power supply module are configured to be assembled or separated individually. Thus, to replace the light source, only the light irradiating unit needs to be separated from the light irradiating device without separating the power feed unit. Therefore, the replacement of the light source can be carried out in the easy and simple way, so that the maintenance can be improved.

Example 2

In the light irradiating device of the example 1, the light irradiating unit may further comprise a heat transfer module thermally connected with the light source, and the power feed unit may further comprise a cooling module. In a state that the light irradiating unit and the power feed unit are coupled as one body as the first connector and the second connector are connected with each other, the cooling module may come into contact with the heat transfer module to cool the light source through the heat transfer module. In this case, in the state that the light irradiating unit and the power feed unit are connected as one body, the heat transfer module and the cooling module are thermally connected, and the light source provided in the light irradiating unit is cooled by the cooling module provided in the power feed unit. Accordingly, when the light source is operated, the heat generated from the light source is cooled by the cooling module, so that a variation of a wavelength of the light caused by a temperature drift can be suppressed. Meanwhile, when replacing the light source, since the cooling module is provided in the power feed unit which is not a target of the replacement, it is unnecessary to disassemble and re-assemble the cooling module. Therefore, in the replacement of the light source, a series of operations including the recovery of the coolant, the disassembling and the re-assembling of the cooling module and the charging of the coolant of the cooling module is not necessary. Therefore, the maintenance can be further improved.

Example 3

In the light irradiating device of the example 2, the heat transfer module may have a first contact surface exposed to an outside of the light irradiating unit, and the cooling module may have a second contact surface exposed to an outside of the power feed unit. In the state that the light irradiating unit and the power feed unit are coupled as one body as the first connector and the second connector are connected with each other, the first contact surface of the heat transfer module and the second contact surface of the cooling module may be in contact with each other. In this case, since an area where the heat exchange is performed is relatively large, the light source can be effectively cooled.

Example 4

In the light irradiating device of the example 2 or 3, the heat transfer module may be configured to be attracted to the cooling module. In this case, the connection/separation of the heat transfer module to/from the cooling module can be carried out very easily. Furthermore, since the heat transfer module can be easily brought into firm contact with the cooling module through the attraction, the light source can be more effectively cooled.

Example 5

In the light irradiating device of any one of the examples 2 to 4, the cooling module may be a water cooling type heat exchanger.

Example 6

In the light irradiating device of any one of the examples 2 to 5, the light irradiating unit may further comprise a Peltier element, a cooling part of the Peltier element may be thermally connected with the light source, and a heating part of the Peltier element may be thermally connected with the heat transfer module. In this case, by controlling the Peltier element, the temperature of the light source can be maintained at the target temperature with high accuracy.

Example 7

The light irradiating device of any one of the examples 2 to 6 may further comprise a pressing member configured to press at least a first one of the heat transfer module or the cooling module against a second one thereof. In this case, when coupling the light irradiating unit and the power feed unit as one body, the first one of the heat transfer module and the cooling module is pressed against the second one thereof, so that the two modules can be more easily brought into firm contact with each other. Therefore, the light source can be cooled more effectively.

According to the light irradiating device of the present disclosure, the maintenance thereof can be improved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A light irradiating device, comprising:
a substrate holder configured to hold a substrate;
a light irradiating unit; and
a power feed unit,
wherein the light irradiating unit comprises:
a light source configured to irradiate light to a surface of the substrate; and
a first connector electrically connected with the light source, and
wherein the power feed unit comprises:
a power supply module configured to supply a power to the light source; and
a second connector electrically connected with the power supply module and configured to be connected to or disconnected from the first connector, and
wherein the light irradiating unit and the power feed unit are coupled as one body as the first connector and the second connector are connected, and are separated from each other as the first connector and the second connector are disconnected from each other,
wherein the light irradiating unit further comprises a heat transfer module thermally connected with the light source,
the power feed unit further comprises a cooling module, and
in a state that the light irradiating unit and the power feed unit are coupled as one body as the first connector and the second connector are connected with each other, the cooling module comes into contact with the heat transfer module to cool the light source through the heat transfer module.

2. The light irradiating device of claim 1,
wherein the heat transfer module has a first contact surface exposed to an outside of the light irradiating unit,
the cooling module has a second contact surface exposed to an outside of the power feed unit, and
in the state that the light irradiating unit and the power feed unit are coupled as one body as the first connector and the second connector are connected with each other, the first contact surface of the heat transfer module and the second contact surface of the cooling module are in contact with each other.

3. The light irradiating device of claim 1,
wherein the heat transfer module is configured to be attracted to the cooling module.

4. The light irradiating device of claim 1,
wherein the cooling module is a water cooling type heat exchanger.

5. The light irradiating device of claim 1,
wherein the light irradiating unit further comprises a Peltier element,
a cooling part of the Peltier element is thermally connected with the light source, and
a heating part of the Peltier element is thermally connected with the heat transfer module.

6. The light irradiating device of claim 1, further comprising:
a pressing member configured to press at least a first one of the heat transfer module or the cooling module against a second one thereof.

7. The light irradiating device of claim 2,
wherein the heat transfer module is configured to be attracted to the cooling module.

8. The light irradiating device of claim 7,
wherein the cooling module is a water cooling type heat exchanger.

9. The light irradiating device of claim 8,
wherein the light irradiating unit further comprises a Peltier element,
a cooling part of the Peltier element is thermally connected with the light source, and
a heating part of the Peltier element is thermally connected with the heat transfer module.

10. The light irradiating device of claim 9, further comprising:
a pressing member configured to press at least a first one of the heat transfer module or the cooling module against a second one thereof.

* * * * *